(12) United States Patent
Hardacker et al.

(10) Patent No.: US 10,848,272 B2
(45) Date of Patent: Nov. 24, 2020

(54) ERROR DETECTION IN AUTOMOBILE TELL-TALES

(71) Applicant: QUALCOMM Incorporated, San Diego, CA (US)

(72) Inventors: Robert Hardacker, Fallbrook, CA (US); Rahul Gulati, San Diego, CA (US); Alex Jong, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 45 days.

(21) Appl. No.: 16/216,220

(22) Filed: Dec. 11, 2018

(65) Prior Publication Data

US 2019/0181982 A1   Jun. 13, 2019

Related U.S. Application Data

(60) Provisional application No. 62/598,080, filed on Dec. 13, 2017.

(51) Int. Cl.
| | |
|---|---|
| *H04L 1/00* | (2006.01) |
| *G07C 5/08* | (2006.01) |
| *H03M 13/09* | (2006.01) |
| *H04L 12/40* | (2006.01) |
| *G06F 11/10* | (2006.01) |

(52) U.S. Cl.
CPC ........ *H04L 1/0061* (2013.01); *G06F 11/1004* (2013.01); *G07C 5/0825* (2013.01); *H03M 13/09* (2013.01); *H04L 12/40* (2013.01); *H04L 12/40045* (2013.01); *G07C 5/0808* (2013.01); *H04L 2012/40273* (2013.01)

(58) Field of Classification Search
CPC . H04L 1/0061; H04L 12/40045; H04L 12/40; H04L 2012/40273; G06F 11/1004; G07C 5/0825; G07C 5/0808; H03M 13/09
See application file for complete search history.

(56) References Cited

U.S. PATENT DOCUMENTS

| | | | |
|---|---|---|---|
| 8,694,879 B1* | 4/2014 | Peichl | H04L 1/0061 714/758 |
| 10,134,139 B2 | 11/2018 | Gulati et al. | |
| 2011/0292059 A1* | 12/2011 | Kobayashi | G09G 5/003 345/520 |
| 2012/0320988 A1* | 12/2012 | Kamiya | H04N 19/90 375/240.18 |
| 2016/0082963 A1* | 3/2016 | Slaton | B60W 50/14 701/93 |
| 2016/0241829 A1* | 8/2016 | Qu | G09G 5/006 |
| 2018/0083765 A1* | 3/2018 | Oh | H03M 9/00 |

* cited by examiner

*Primary Examiner* — Thien Nguyen
(74) *Attorney, Agent, or Firm* — Holland & Hart LLP

(57) ABSTRACT

Systems and method for error detection in automobile tell-tales are provided. An initial cyclic redundancy check (CRC) for a tell-tale to be calculated and stored at a primary control system within the vehicle. When a fault or condition is detected which generates the tell-tale, the primary control system passes video information to a display embedded control unit (ECU) along with the initial CRC. A circuit in the display ECU performs its own CRC calculation and compares the initial CRC to the calculated CRC. If there is not a match, then a fault indication may be provided to the primary control system for action by the primary control system. Still further, back up or fail-operational options may be invoked so that the tell-tale is provided to the operator.

21 Claims, 10 Drawing Sheets

ERROR DETECTION IN AUTOMOBILE TELL-TALES

PRIORITY CLAIM

The present application claims priority to U.S. Provisional Patent Application Ser. No. 62/598,080 filed on Dec. 13, 2017 and entitled "ERROR DETECTION IN AUTOMOBILE TELL-TALES," the contents of which is incorporated herein by reference in its entirety.

BACKGROUND

I. Field of the Disclosure

The technology of the disclosure relates generally to automobiles and, more specifically, to tell-tales in automobiles and detecting whether the tell-tales have been displayed properly.

II. Background

The automotive industry began widespread infiltration into society before the advent of computers. Early computing devices were too large and cumbersome to be practical for incorporation into automobiles. However, as the size and cost of computing devices has come down, vehicles, and automobiles in particular, have embraced the incorporation of computing devices into the regular operation of the vehicles.

While engine management and exhaust control saw the first widespread use of computing devices in automobiles, more recent automobiles have seen a proliferation of computing devices into almost every system with sensors capable of monitoring almost any function related to operation of the vehicle as well as sophisticated audiovisual systems capable of providing robust multimedia experiences for operators and passengers. The proliferation of computing power and computing devices has led to an increase in efforts to assist in the safe operation of such vehicles.

One early effort to assist in the safe operation of a vehicle was a basic tell-tale that alerted the user of a condition in the vehicle such as open doors, failed blinker bulbs, high-beam indication, and the like. Subsequent tell-tales expanded into things like engine anomalies (e.g., the so-called "check engine" light), low tire pressure, and the like. As the numbers of sensors in the vehicle has increased, so too have the number and content of the tell-tales. Early tell-tales were typically a simple bulb that back-lit a cutout of the tell-tale. That is, the panel included cutouts shaped like the desired tell-tale, and a bulb was selectively activated behind the cutout to provide the tell-tale to the operator. With the advent of more sophisticated displays, the tell-tale has been updated. In particular, with modern liquid crystal displays (LCD) or organic light emitting diode (OLED), the need for cutouts or dedicated bulbs has diminished, and new tell-tales are rendered on the display by a graphics processor associated with the display. The graphics processor for a given display receives instructions to render the appropriate tell-tale. The instructions come from a control system that is usually remotely positioned from the display and are typically in the form of specific colors and specific pixels to be illuminated. With the move away from dedicated tell-tales to rendering tell-tales on a display, there may be instances when it is appropriate to verify that the tell-tale has been rendered correctly.

SUMMARY OF THE DISCLOSURE

Aspects disclosed in the detailed description include systems and methods for error detection in automobile tell-tales. In particular, exemplary aspects allow an initial cyclic redundancy check (CRC) for a tell-tale to be calculated and stored at a primary control system within the vehicle. When a fault or condition is detected which generates the tell-tale, the primary control system passes video information to a display embedded control unit (ECU) along with the initial CRC. A circuit in the display ECU performs its own CRC calculation and compares the initial CRC to the calculated CRC. If there is not a match, then a fault indication may be provided to the primary control system for action by the primary control system. By providing this additional error detection, exemplary aspects of the present disclosure allow better compliance with relevant automotive safety standards and any regulations based thereon such as the automotive safety integrity level (ASIL) targets. Still further, back up or fail-operational options may be invoked so that the tell-tale is provided to the operator.

In this regard in one aspect, a method for detecting errors in signal transmission in a vehicle is disclosed. The method includes generating video information for a tell-tale at a primary control system. The method also includes sending the video information for the tell-tale to a display ECU at a first rate. The method also includes sending a CRC with the video information to the display ECU at a second rate slower than the first rate. The method also includes receiving a fault indication from the display ECU if there is an error based on the CRC.

In another aspect, an ECU is disclosed. The ECU includes a bus interface configured to be coupled to a bus. The ECU also includes a serializer coupled to the bus interface. The ECU also includes a memory containing video information for rendering a tell-tale and an associated CRC for the video information. The ECU also includes a control system operatively coupled to the memory and the serializer. The control system is configured to send the video information for the tell-tale to a display ECU at a first rate. The control system is also configured to send the CRC with the video information to the display ECU at a second rate slower than the first rate. The control system is also configured to receive a fault indication from the display ECU if there is an error based on the CRC.

In another aspect, a display ECU for a vehicle is disclosed. The display ECU includes a bus interface configured to be coupled to a bus. The display ECU also includes a deserializer coupled to the bus interface. The display ECU also includes a timing control (TCON) circuit coupled to the deserializer. The display ECU also includes a display configured to receive data from the TCON circuit. The TCON circuit is configured to receive video information for a tell-tale at a first rate. The TCON circuit is also configured to receive an original CRC that has been deserialized by the deserializer from the bus at a second rate slower than the first rate. The TCON circuit is also configured to calculate a new CRC for comparison with the original CRC.

In another aspect, a method is disclosed. The method includes receiving video information from a bus at a first rate. The method also includes receiving CRC information associated with the video information at a second rate. The method also includes deserializing the video information. The method also includes calculating a new CRC based on the video information. The method also includes comparing the CRC information to the new CRC. The method also includes sending a fault indication when the CRC information does not match the new CRC.

DETAILED DESCRIPTION

Figure 1:
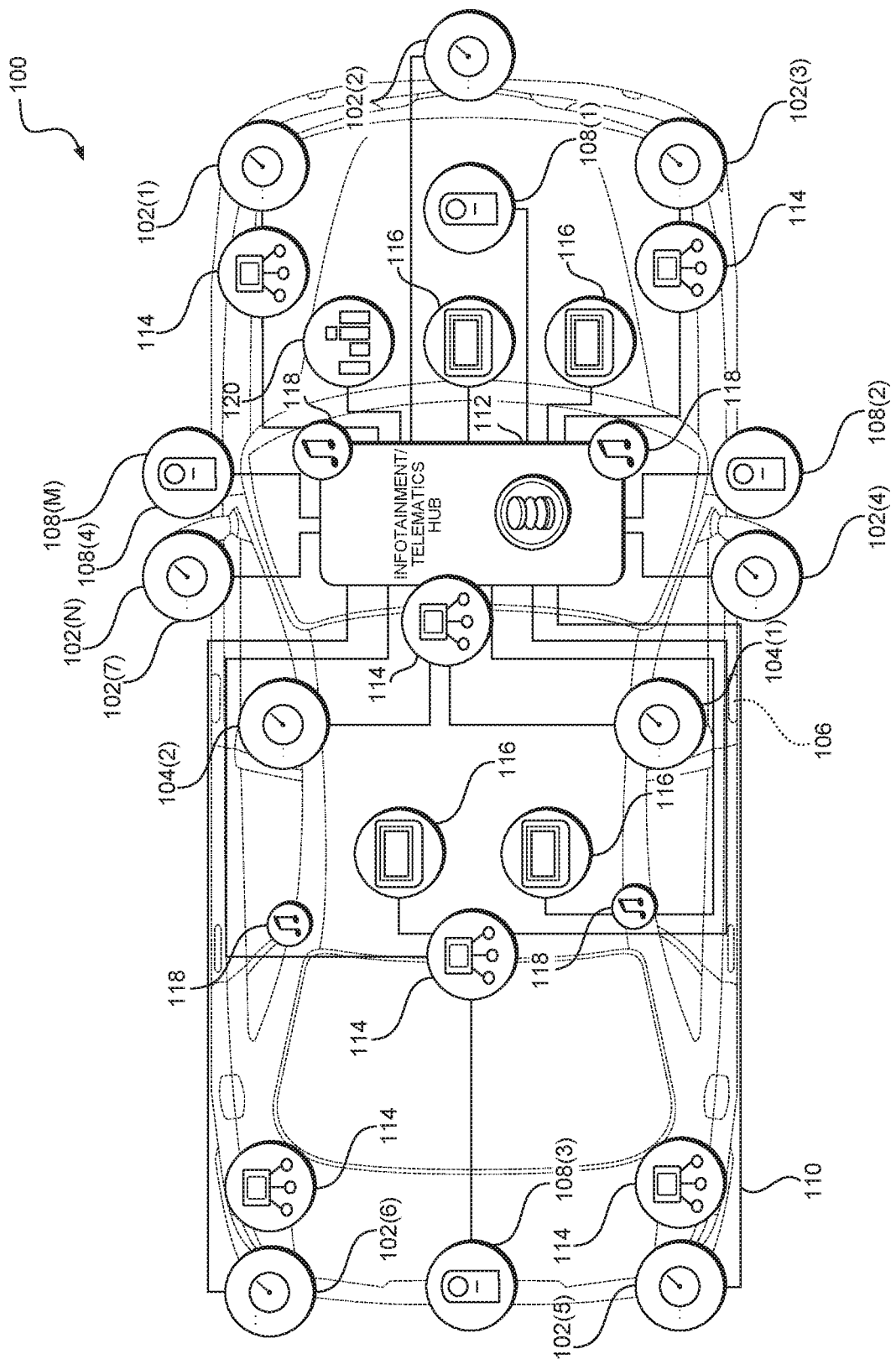
FIG. 1 is a simplified schematic diagram of an exemplary computing system within a vehicle.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for error detection in automobile tell-tales. In particular, exemplary aspects allow an initial cyclic redundancy check (CRC) for a tell-tale to be calculated and stored at a primary control system within the vehicle. When a fault or condition is detected which generates the tell-tale, the primary control system passes video information to a display embedded control unit (ECU) along with the initial CRC. A circuit in the display ECU performs its own CRC calculation and compares the initial CRC to the calculated CRC. If there is not a match, then a fault indication may be provided to the primary control system for action by the primary control system. By providing this additional error detection, exemplary aspects of the present disclosure allow better compliance with relevant automotive safety standards or regulations based thereon such as the automotive safety integrity level (ASIL) targets which are part of International Organization for Standardization (ISO) 26262, which in turn is derived from International Electrotechnical Commission (IEC) 61508. Still further, back up or fail-operational options may be invoked so that the tell-tale is provided to the operator.

In this regard, FIG. 1 is a simplified block diagram of a vehicle 100. The vehicle 100 is illustrated as an automobile, but could be another form of vehicle such as a motorcycle, a boat, a plane, or the like. The vehicle 100 may include a variety of sensors 102(1)-102(N), where, as illustrated, N=7. It should be appreciated that more or fewer than seven sensors 102 may be present. The sensors 102(1)-102(N) may be proximity sensors that use sonar, lasers, or some form of radar to detect proximate objects. Additionally, the vehicle 100 may include one or more internal sensors 104(1)-104(2). The internal sensors 104(1)-104(2) may detect whether a door 106 is open or other internal condition of the vehicle 100 (e.g., detecting whether a driver is asleep or inattentive). The vehicle 100 may further include one or more cameras 108(1)-108(M), where, as illustrated, M=4. It should be appreciated that more or fewer than four cameras 108 may be present. The vehicle 100 may have a network 110 that couples some or all the sensors 102 and 104 to a hub 112. Network bridges 114 may be present to assist in providing the network 110. Displays 116 and speakers 118 may also be associated with the network 110. The hub 112 may include a primary control system that accesses software or data stored in memory 120. Additional sensors (not illustrated) may be present in tires to monitor pressure therein. Likewise, additional sensors may monitor fuel levels, engine temperatures, oil levels, anti-lock brake status, and the like. All such sensors may report to the hub 112 through the network 110 or other communication bus (e.g., for example, the tire sensors may be connected wirelessly to the hub 112 or other processor, which in turn reports to the hub 112).

The network 110 may be a single homogenous network such as a common bus having a multi-drop or ring topology, or may be formed from distinct communication links such as separate point-to-point cables.

In normal operation, the sensors, whether they be the sensors 102, 104, or other non-illustrated sensors, may detect a condition and send a signal to the hub 112 indicating that a condition has occurred or is occurring. The hub 112 causes a tell-tale to be presented to the operator so that the operator is informed of the condition (e.g., low tire pressure or anti-lock brake failure). More details on how the hub 112 causes the presentation of a tell-tale are provided below.

Figure 2:
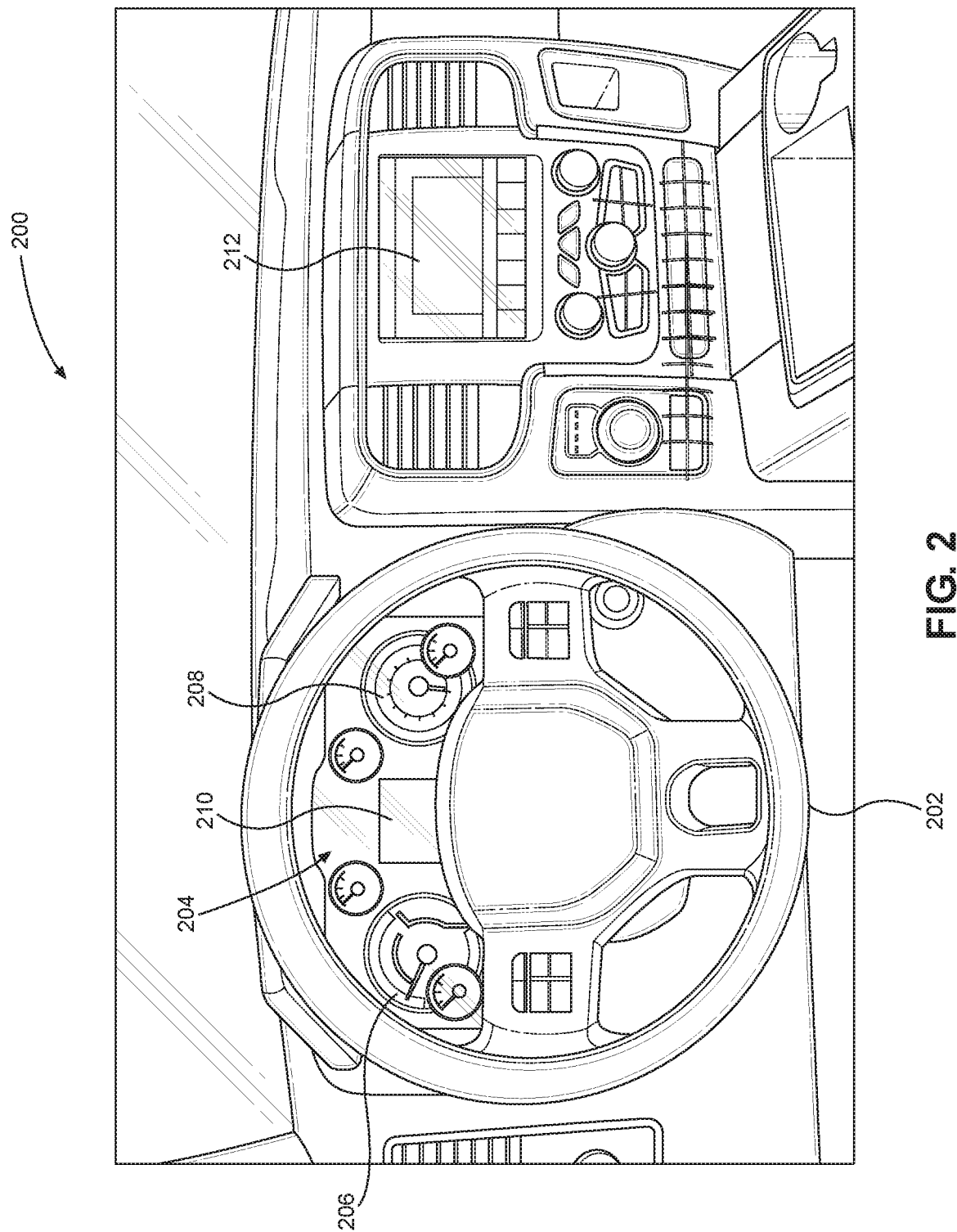
FIG. 2 is a front elevational view of an exemplary dashboard having a plurality of displays.

FIG. 2 is front elevational view of a dashboard 200 of a vehicle. The dashboard 200 includes a steering wheel 202. An instrument cluster display 204 is provided in the dashboard 200 in line with the steering wheel 202. The instrument cluster display 204 may be a liquid crystal display (LCD), a plasma display, or the like, and may include one or more additional analog display components or be broken into fields where different information is provided. For example, a tachometer 206 and a speedometer 208 may be positioned on either side of an LCD display 210. Additional displays such as a fuel gauge, an engine temperature gauge, a battery level gauge, and an oil pressure gauge or the like may be present. The dashboard 200 further includes a second display 212 that may be referred to as a console or infotainment display. The second display 212 may be an LCD, plasma display, touch screen, or the like. In normal use, the second display 212 may provide information about the radio station being played, any further information received from the radio station (e.g., artist name, song name), traffic information, navigation information, climate control information, phone call information if the vehicle is equipped with hands-free phone operations, and the like. Note that these functions may have duplicate control systems. Further, some controls may be present on the steering wheel 202.

Figure 3:
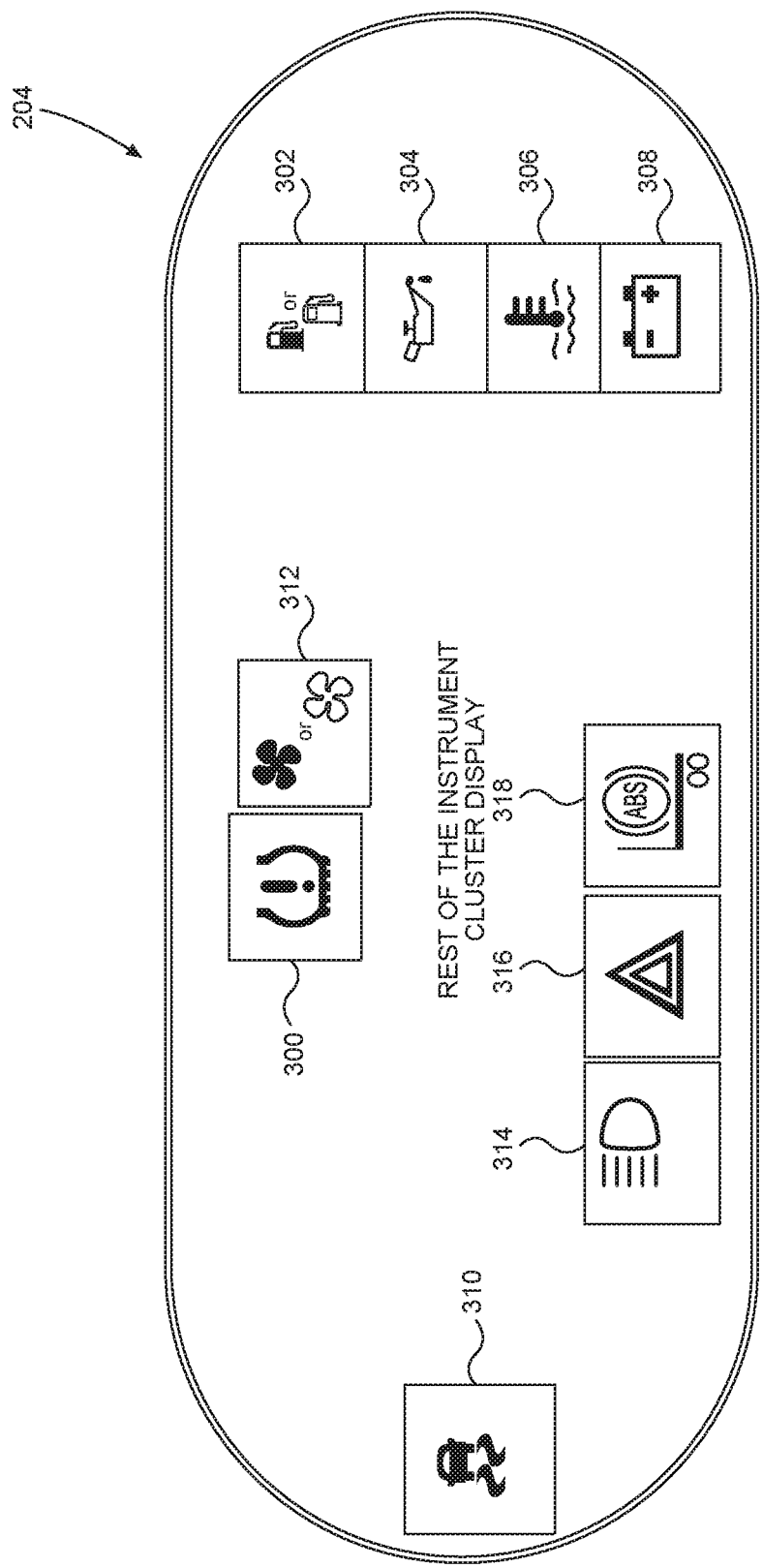
FIG. 3 is a front elevational view of a display having a plurality of exemplary tell-tales illuminated thereon.

As used herein, a tell-tale is an indicator of a malfunction of a system or other condition of a system within a motor vehicle by an illuminated symbol or text legend. Exemplary tell-tales are illustrated in the instrument cluster display 204 in FIG. 3. Specifically, FIG. 3 illustrates a low tire pressure tell-tale 300, a low fuel tell-tale 302, an oil pressure tell-tale 304, a temperature tell-tale 306, a battery level tell-tale 308, an electronic stability control tell-tale 310, a heating/air conditioning fan tell-tale 312, a bright headlight tell-tale 314, a hazard light tell-tale 316, and an antilock brake system tell-tale 318. It should be appreciated that other tell-tales may also be used and the present disclosure is not limited to just those listed here. Likewise, the precise placement of a tell-tale in the instrument cluster display 204 is not a central tenant of the present disclosure, and different automotive manufacturers may arrange the number, type, and placement of tell-tales.

For dynamic displays such as an LCD, organic light emitting diode (OLED), or the like, the tell-tales are more than bulbs backlighting a cut-out. Instead, the tell-tales are a video image that is actively presented on the display through activation of individual pixels at particular colors and particular luminosities. The instructions to illuminate a tell-tale are thus video instructions. Given that the same tell-tales are used repeatedly and in the same location (for a given display), the video information associated with a particular tell-tale is typically pregenerated and stored in a primary control system of the vehicle (e.g., memory associated with the hub 112 of FIG. 1). Such storage typically takes place at the time of manufacture or during routine software updates such as during a maintenance visit. At the appropriate time, the video information is sent from the primary control system of the vehicle to a display controller, which renders the video information and causes the display to present the appropriate tell-tale. It is conceivable that the video information may be corrupted by interference or noise within the vehicle. Further, it is conceivable that the video signal may be hacked. Exemplary aspects of the present disclosure help insure that the correct video information is received at the display controller such that the correct tell-tale is presented to the vehicle operator.

In normal operation, the instrument cluster display 204 is responsive to a local cluster microcontroller unit (MCU), and the second display 212 is responsive to a local infotainment system or second MCU. The local MCUs may communicate with a controller though a cable or through the vehicle network. This arrangement is illustrated with reference to FIGS. 4A, 4B, and 5. In particular, the instrument cluster display 204 may be positioned in an embedded control unit (ECU) 400, sometimes referred to as a display ECU. The ECU 400 includes an MCU 402 and a serializer/deserializer 404. Note that while illustrated as a single block, the serializer and deserializer components could be separate elements. The serializer/deserializer 404 primarily deserializes signals from a cable 406, wherein the signals consist of pixel data, horizontal and vertical timing control, and additional information, such as cyclic redundancy check (CRC) information, which will be sent to the instrument cluster display 204 and, in particular, to a timing control (TCON) circuit 204A. While not specifically illustrated, it should be appreciated that the cable 406 interoperates with a compatible cable or bus interface to allow signals to be placed on the cable 406 as part of a transmission activity and retrieved therefrom as part of a receive activity. The MCU 402 controls and monitors the components on the ECU 400. The MCU 402 may control tasks such as power up/down sequencing of the display or monitoring the functionality and operation of other components on the ECU 400. The MCU 402 may further be connected to a controller area network (CAN) 414. While current designs pass the pixel data/image frame in a raster scan format, the present disclosure is not so limited, and tell-tale state information may be sent or the tell-tale may be sent in some other format that is processed so as to provide instructions to illuminate a tell-tale. On receipt of the CRC information that accompanies the tell-tale, one of three circuits may calculate a new CRC and compare the new CRC to the original or initial CRC that came over the cable 406. Specifically, the serializer/deserializer 404 may include additional circuitry to handle the CRC information and comparison; the MCU 402 may receive the original CRC, calculate the new CRC and compare; or the TCON circuit 204A may receive the original CRC, calculate the new CRC, and compare. Note that these calculations and comparisons are not mutually exclusive and redundant checks may be performed.

It should be appreciated that the original or initial CRC may be sent over the cable 406 or through the CAN 414 as needed or desired. However, so that the CRC arrives temporally proximate the video information that causes the tell-tale to be rendered by the TCON circuit 204A, an exemplary aspect of the present disclosure may provide the CRC in the vertical or horizontal hold (also sometimes referred to as vertical blanking and horizontal blanking (generically video blanking)) portion of the video information that is sent over the cable 406. While the vertical hold position is specifically contemplated, other locations, in-band, or out-of-band may be used to send the CRC.

Current implementations of the CAN 414 are relatively low-bandwidth systems. However, the use of "CAN" in the present disclosure is not limited to such low-bandwidth systems and includes high-speed systems such as ethernet, Peripheral Component Interconnect express (PCIE), Universal Serial Bus (USB), or the like which may be implemented in a vehicle to serve as a central network backbone. Some industry literature may refer to the CAN as a vehicle network. Likewise, the CAN 414 is not necessarily a monolithic bus system, but could be a cloud of a plurality of buses that collectively allow communication between the elements.

The serializer/deserializer 404 may send backchannel or status information across the cable 406 to an ECU 408. While this backchannel information is normally serialized, it is possible that the data is already formatted as a single stream of data and the serializer may be omitted. In an exemplary aspect, a confirmation that the CRC was compared at the ECU 400 and that the comparison shows the CRC is correct (and thus the video information is not corrupted) is sent back to the ECU 408. In another exemplary aspect, a fault indication signal is sent when the CRCs are compared and a difference (no match) is detected.

The ECU 408 may be the hub 112 of FIG. 1 and may include a serializer/deserializer 410. In some implementations, better illustrated in FIG. 4A, the ECU 408 may include a cluster system on a chip (SoC) integrated into a single chip with an MCU to be a combined cluster SoC/MCU 412. The combined cluster SoC/MCU 412 may communicate with other elements in the vehicle through the CAN 414. Alternatively, as illustrated in FIG. 4B, the cluster SoC 412B may be separate and distinct from the MCU 412C. As illustrated, the MCU 412C is coupled to the CAN 414. While FIG. 4B shows the MCU 412C coupled to the CAN 414, it is possible that the cluster SoC 412B may be coupled to the CAN 414 or both the cluster SoC 412B and the MCU 412C are coupled to the CAN 414. The serializer/deserializer 410 primarily serializes signals such as pixel data, horizontal and vertical timing control, and additional information, such as CRC information, for transmission over the cable 406 to the ECU 400, but may receive backchannel information from the ECU 400. The cable 406 may be a coaxial cable, a twisted pair, or the like and generally is configured to carry a differential signal.

Figure 4A:
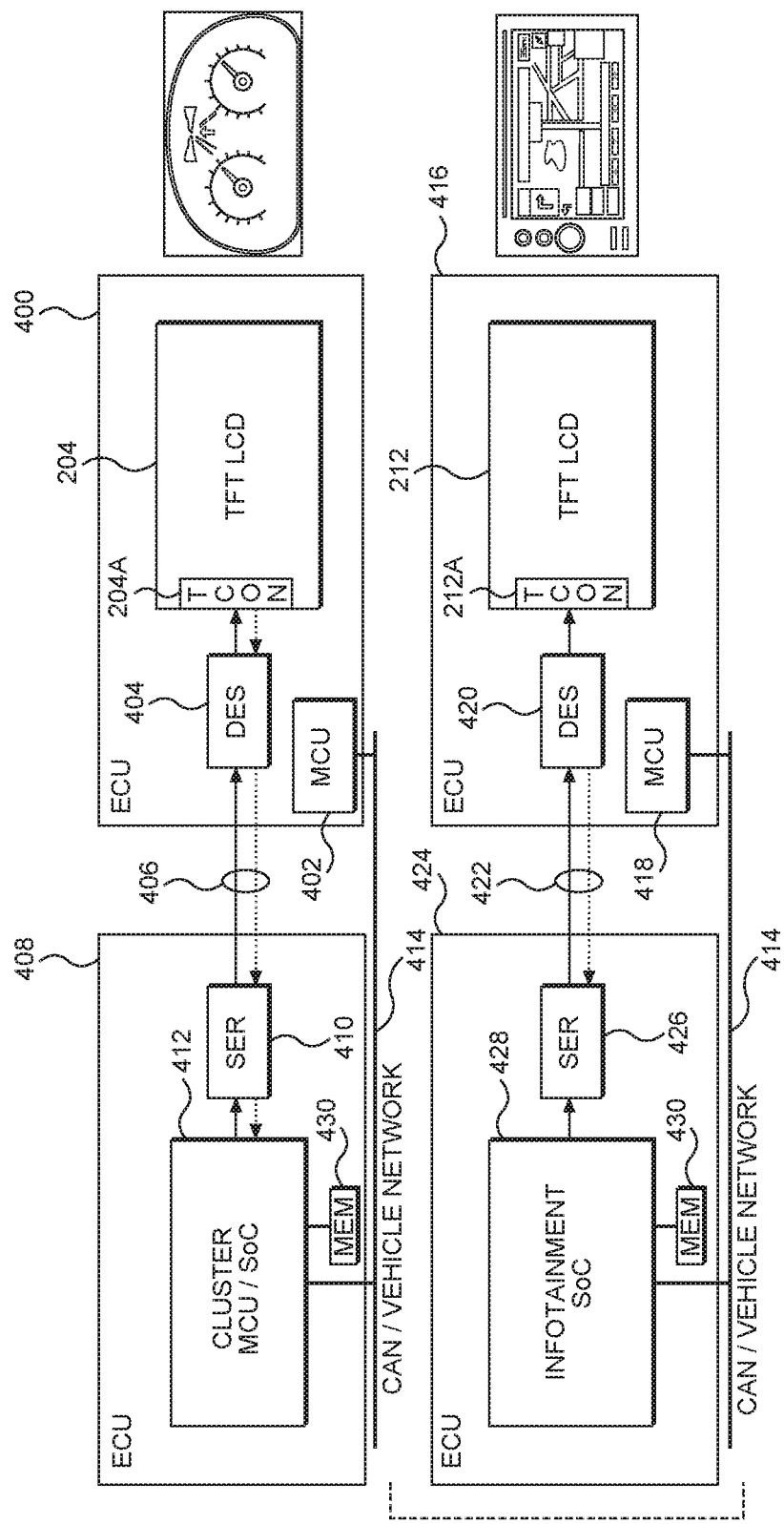
FIG. 4A is a block diagram of the plural displays of FIG. 2 with associated controllers within a vehicle according to a first exemplary aspect.
Figure 4B:
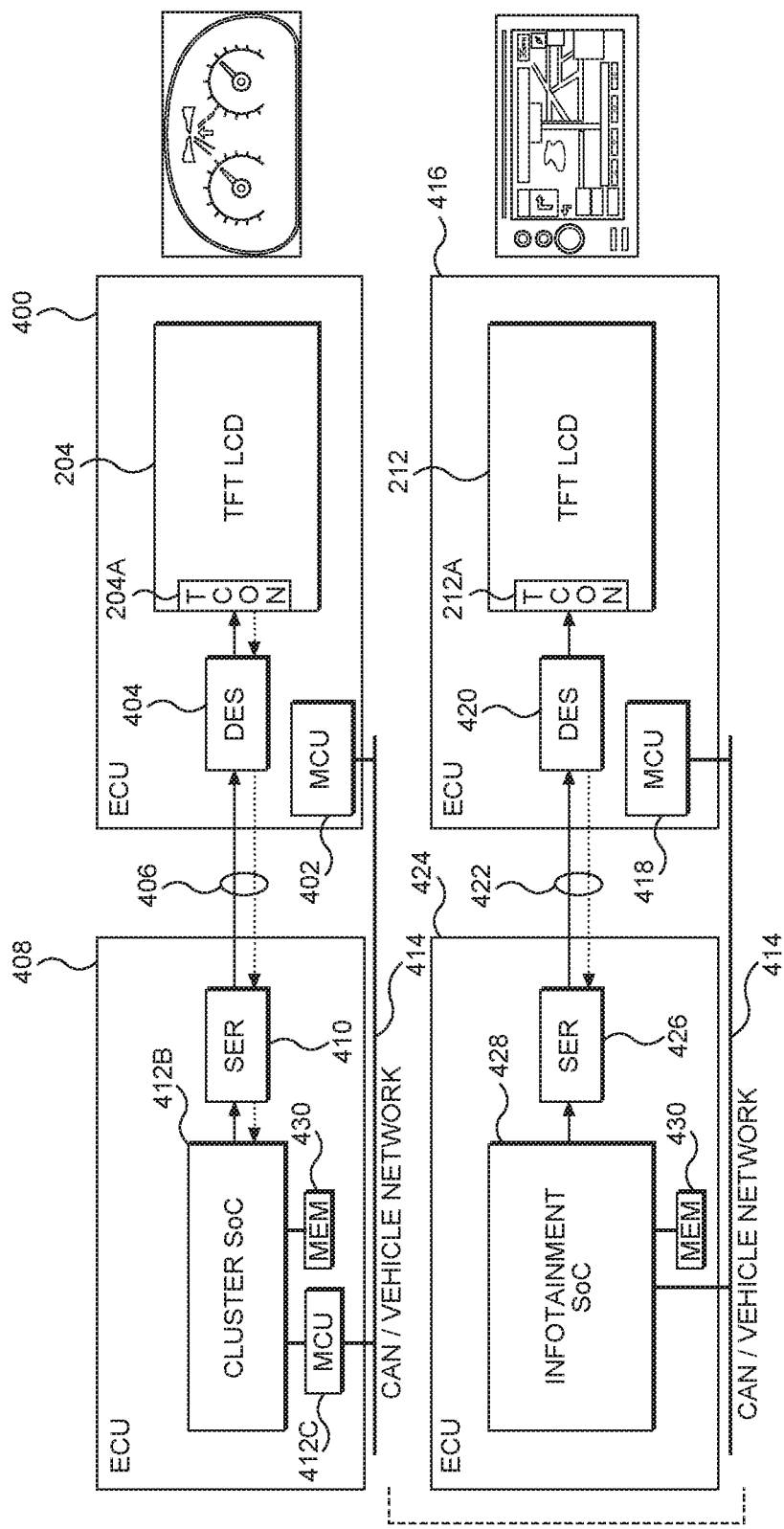
FIG. 4B is a block diagram of the plural displays of FIG. 2 with associated controllers like those of FIG. 4A, but with distinct integrated circuits (ICs) in the embedded control unit (ECU)

With continued reference to FIG. 4A, the second display 212 may be housed in its own ECU 416 which may have a display MCU 418 and a serializer/deserializer 420. The serializer/deserializer 420 primarily deserializes signals from a cable 422, wherein the signals consist of pixel data, horizontal and vertical timing control, and additional information, such as CRC information, which will be sent to the second display 212 and, in particular, to a TCON circuit 212A. The serializer/deserializer 420 may send backchannel or control information across the cable 422 to an ECU 424, which may be part of the hub 112 of FIG. 1. The ECU 424 may include a serializer/deserializer 426 and an infotainment SoC 428. Note that the infotainment SoC 428 is also an MCU, although not labeled as such in the drawings. The infotainment SoC 428 may further communicate over the CAN 414. The serializer/deserializer 426 primarily serializes signals such as pixel data, horizontal and vertical timing control, and additional information, such as CRC information, for transmission over the cable 422 to the ECU 416, but may receive backchannel information from the ECU 416. The cable 422 may be a coaxial cable, a twisted pair, ethernet cable, or the like and generally is configured to carry a differential signal.

Note that the infotainment SoC 428 of FIGS. 4A and 4B may likewise include the MCU (as illustrated), or similar to the ECU 408 of FIG. 4B, the MCU may be a distinct and separate IC and may couple to the CAN 414 such that the infotainment SoC 428 communicates through the separate MCU or, as discussed above, both the infotainment SoC 428 and the MCU may be coupled to the CAN 414 or the MCU may communicate with the CAN 414 through the infotainment SoC 428.

In practice, as the primary control system, the combined cluster SoC/MCU 412 receives reports from sensors about the health and operation of components of the vehicle such as tire pressure, oil pressure, fuel level, and the like. Based on these reports, the combined cluster SoC/MCU 412 may send the display image pixel data or other signal (generically "video information") to the instrument cluster display 204 to update the status of one or more telltales on the instrument cluster display 204. The present disclosure adds CRC information to the instrument cluster display 204 with the video information. As noted above, different elements within the ECU 400 may calculate a new CRC and compare the new CRC to the provided CRC so as to detect a match or lack of a match. In the event that there is not a match between the CRCs, the ECU 400 may send a fault indication signal to the combined cluster SoC/MCU 412.

Figure 5:
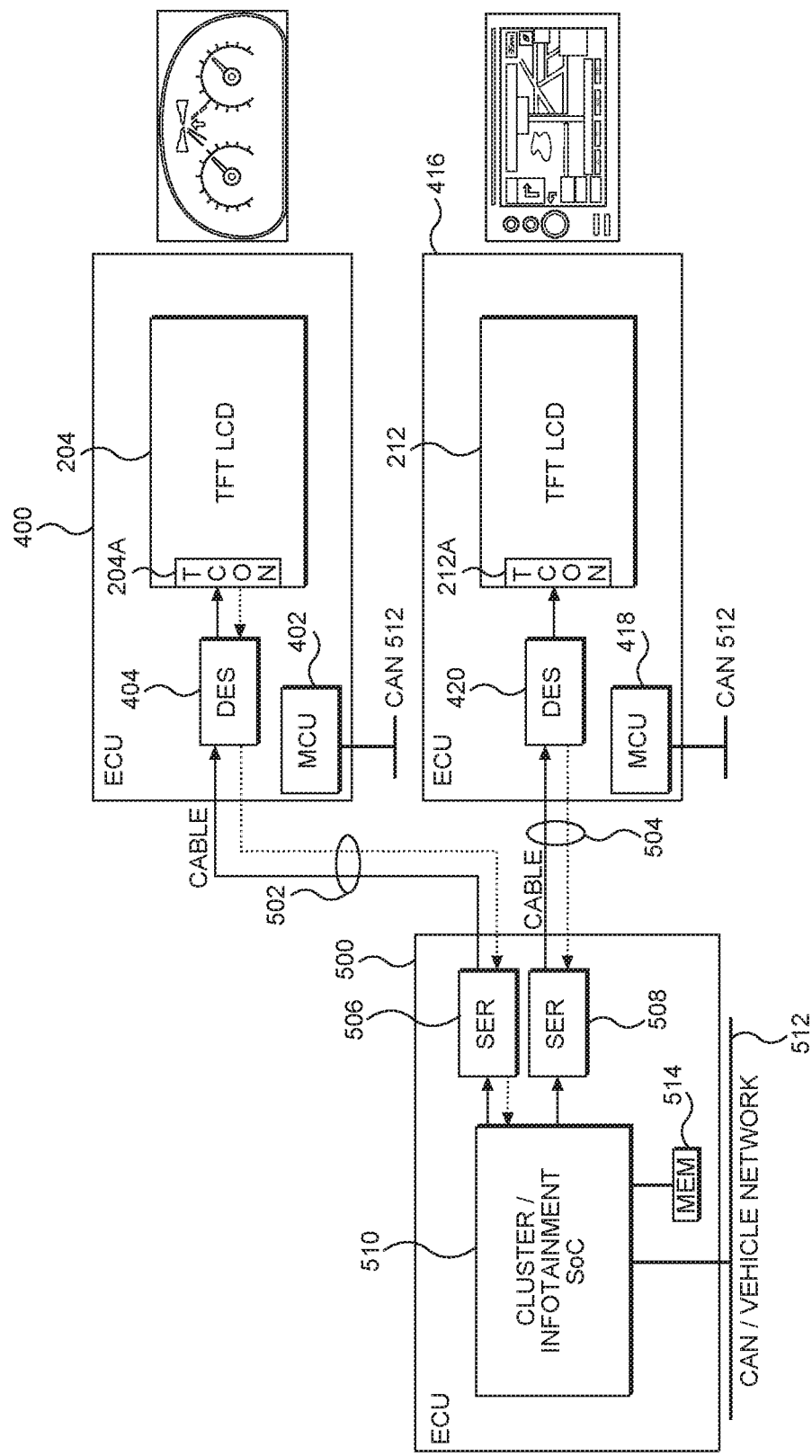
FIG. 5 is a block diagram of the plural displays of FIG. 2 with associated controllers within a vehicle according to a second exemplary aspect.

While FIG. 4A illustrates a system that has a separate controller for the instrument cluster display 204 and the second display 212, there are other configurations that may exist. For example, as illustrated in FIG. 5, a single controller may control the instrument cluster display 204 and the second display 212. In this regard, FIG. 5 illustrates a second arrangement where the ECU 400 and the ECU 416 both communicate with a single ECU 500 over a cable 502 and a cable 504, respectively. The ECU 500 includes two serializer/deserializers 506 and 508 for transmitting pixel data (i.e., video information) or other communication (e.g., CRC) with the ECUs 400 and 416, respectively. The ECU 500 further includes a cluster/infotainment SoC 510. It should be appreciated that the cluster/infotainment SoC 510 is an MCU. The cluster/infotainment SoC 510 may also be coupled to a CAN 512 to receive signals from sensors and the like. As illustrated, the cluster/infotainment SoC 510 includes the MCU, but the MCU may be a separate and distinct IC. Such separate MCU may be coupled to the CAN 512 and the cluster/infotainment SoC 510 may communicate through the MCU or both may be coupled to the CAN 512 or the MCU may communicate with the CAN 512 through the cluster/infotainment SoC 510.

In relevant part, the ECU 500 operates like the ECU 408 in that it sends CRC information with the video information to the ECU 400 and receives a fault indication signal from the ECU 400 when there is not a match between the original CRC and the CRC calculated at the ECU 400.

Note that the CRC may be pre-generated as explained in greater detail below with reference to FIG. 6A or may be calculated at the time the video information about the tell-tale is sent to the instrument cluster display 204. If the CRC is pre-generated, it may be stored in a memory associated with the combined cluster SoC/MCU 412 or the cluster/infotainment SoC 510 such as a non-volatile memory 430 (FIG. 4A) or non-volatile memory 514 (FIG. 5).

Figure 6A:
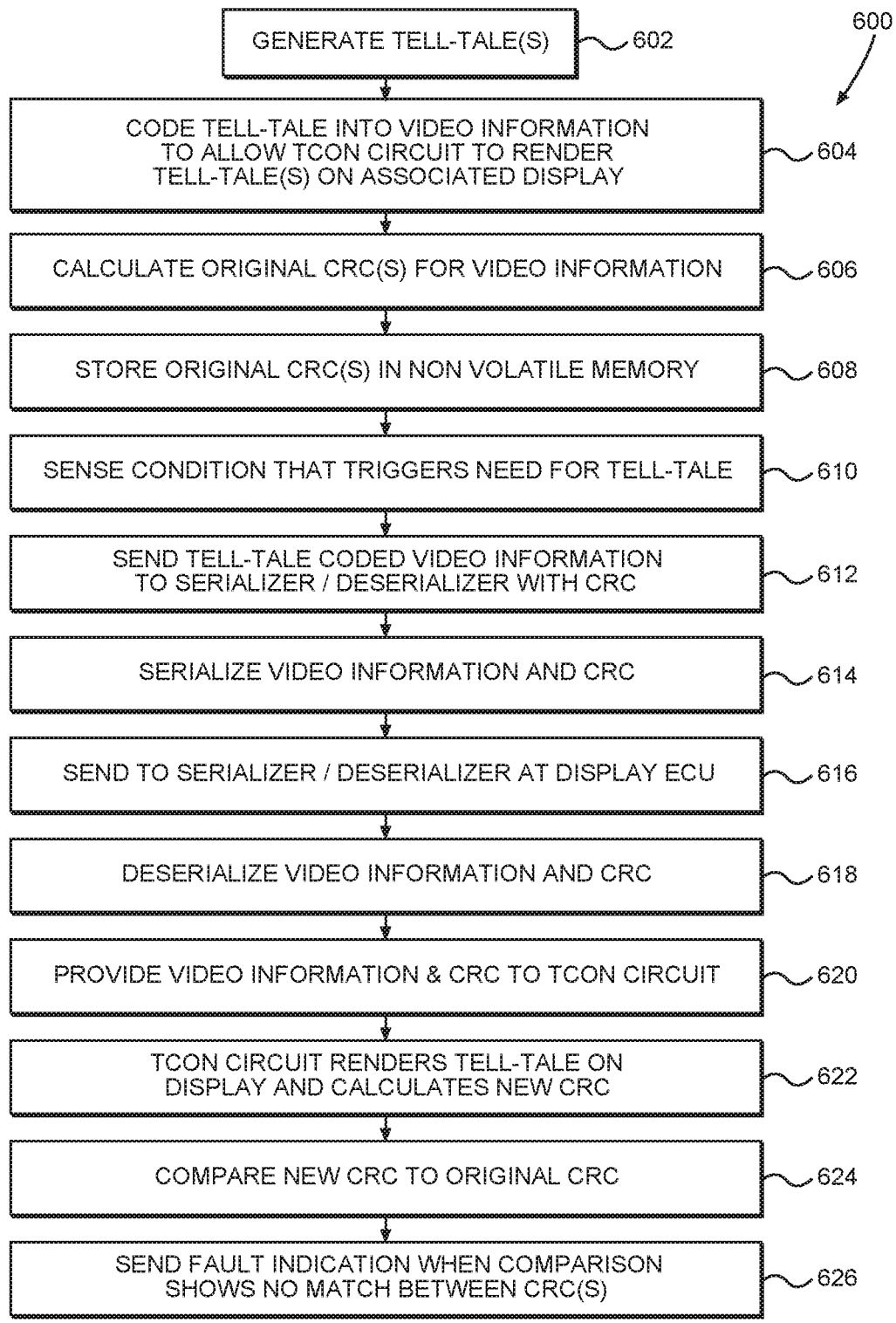
FIG. 6A is a flowchart illustrating an exemplary process for providing an error detection code to the ECU of the display.

A flowchart of an exemplary process 600 associated with the present disclosure is provided with reference to FIG. 6A. In particular, the process 600 begins with the generation of a tell-tale (block 602). Such tell-tales may be industry normalized (such as a gas pump for low fuel condition) or proprietary as needed or desired. The process 600 continues by coding the tell-tale into video information to allow a TCON circuit to render the tell-tale on an associated display (e.g., the instrument cluster display 204) (block 604) and may be created in any appropriate format (e.g., RGB, YCM, DisplayPort™, or the like).

Based on the video information, an original or initial CRC may be calculated (block 606). In an exemplary aspect, this CRC is calculated by a manufacturer and is stored in the non-volatile memory associated with the primary control system of the vehicle (e.g., the combined cluster SoC/MCU 412 or the cluster/infotainment SoC 510) (block 608). It should be appreciated that if the CRC comes from the manufacturer, there may be an external source used to upload the CRC into the non-volatile memory. There may be other such external sources without departing from the scope of the present disclosure. Alternatively, this CRC may be calculated after the SoC is installed in a vehicle and stored in the same location.

Note that as an additional security measure, a secondary CRC may be calculated and stored representing the video information combined with the original CRC or just the original CRC. The primary control system may pull the video information and the original CRC, perform a CRC calculation and compare to the secondary CRC to assure the integrity of the stored video information.

Regardless of when the video information and original CRC is stored, at some point, normal operation of the vehicle occurs, and a condition is sensed by a sensor that triggers a need for a tell-tale (block 610). The sensor reports the condition to the hub 112, which may include the primary control system of the vehicle (e.g., the combined cluster SoC/MCU 412 or the cluster/infotainment SoC 510) and the combined cluster SoC/MCU 412 sends the video information for the tell-tale to the serializer/deserializer 410 with the CRC that has been retrieved from the memory (block 612). The serializer/deserializer 410 serializes the video information and the CRC (block 614) and sends the serialized data across the cable 406 to the serializer/deserializer 404 in the ECU 400 (block 616).

The serializer/deserializer 404 deserializes the video information and the CRC (block 618) and provides the video information and CRC to the TCON circuit 204A (block 620). The TCON circuit 204A renders the tell-tale on the display and calculates a new or rendered CRC (block 622). The TCON circuit 204A compares the new CRC to the original CRC (block 624) and sends a fault indication when the comparison shows no match between the CRCs (block 626).

As noted above, the calculation and comparison can be done by other circuits within the ECU 400 as needed or desired. For example, the serializer/deserializer 404 may perform the calculation and comparison or the display MCU 402 may perform the calculation and comparison. As still another example, the comparison may be done at the primary control system based on information provided from the display ECU 400. Thus, for example, the TCON circuit 204A may calculate the new or rendered CRC, but then send this value to the combined cluster SoC/MCU 412 or the cluster/infotainment SoC 510 which then does the comparison to the original CRC. Note that in some implementations, no CRC value is sent to the ECU 400. Rather, the ECU 400 (e.g., the serializer/deserializer 404, the MCU 402, or the TCON circuit 204A) may calculate a CRC and then send this value to the combined cluster SoC/MCU 412 or the cluster/infotainment SoC 510 which compares to the stored CRC value.

The above discussion captures the basic concept of sending the CRC information with the video information to the TCON circuit so that error detection may be performed. Once the CRCs are determined to match, the system is confident that the tell-tale is being displayed to the vehicle operator appropriately and the relevant safety regulations are satisfied. In the event that no match is found between the CRCs, the fault indication signal may trigger remedial action as needed or desired. For example, an audible alert may be provided to the operator, a different tell-tale may be illuminated, or the tell-tale may be provided on a different display.

In an exemplary aspect, the CRC information is embedded in the vertical line interval, such as around line twenty-one of the vertical frame. The CRC information may be sent as a frame having a frame number followed by the CRC for each tell-tale. If no tell-tale is rendered, a null packet may be sent.

At the TCON circuit, a ring counter (not illustrated) may be reset each frame number and contain enough counting elements as there are tell-tales. For example, twelve tell-tales would require a frame number and twelve CRCs.

It should be further appreciated that most displays in the United States operate at sixty hertz (60 Hz). It is certainly possible to send the video information and CRC information each frame of the 60 Hz signal. However, such signaling increases the demand on the SoC and serializer sending the information and on the TCON circuit which must calculate and compare for each frame. Likewise, assuming that there are on average thirty-two tell-tales in a given vehicle, the number of permutations of tell-tales illuminated are astronomical. Having pre-generated CRCs for each possible permutation requires a large amount of non-volatile memory.

Figure 7A:
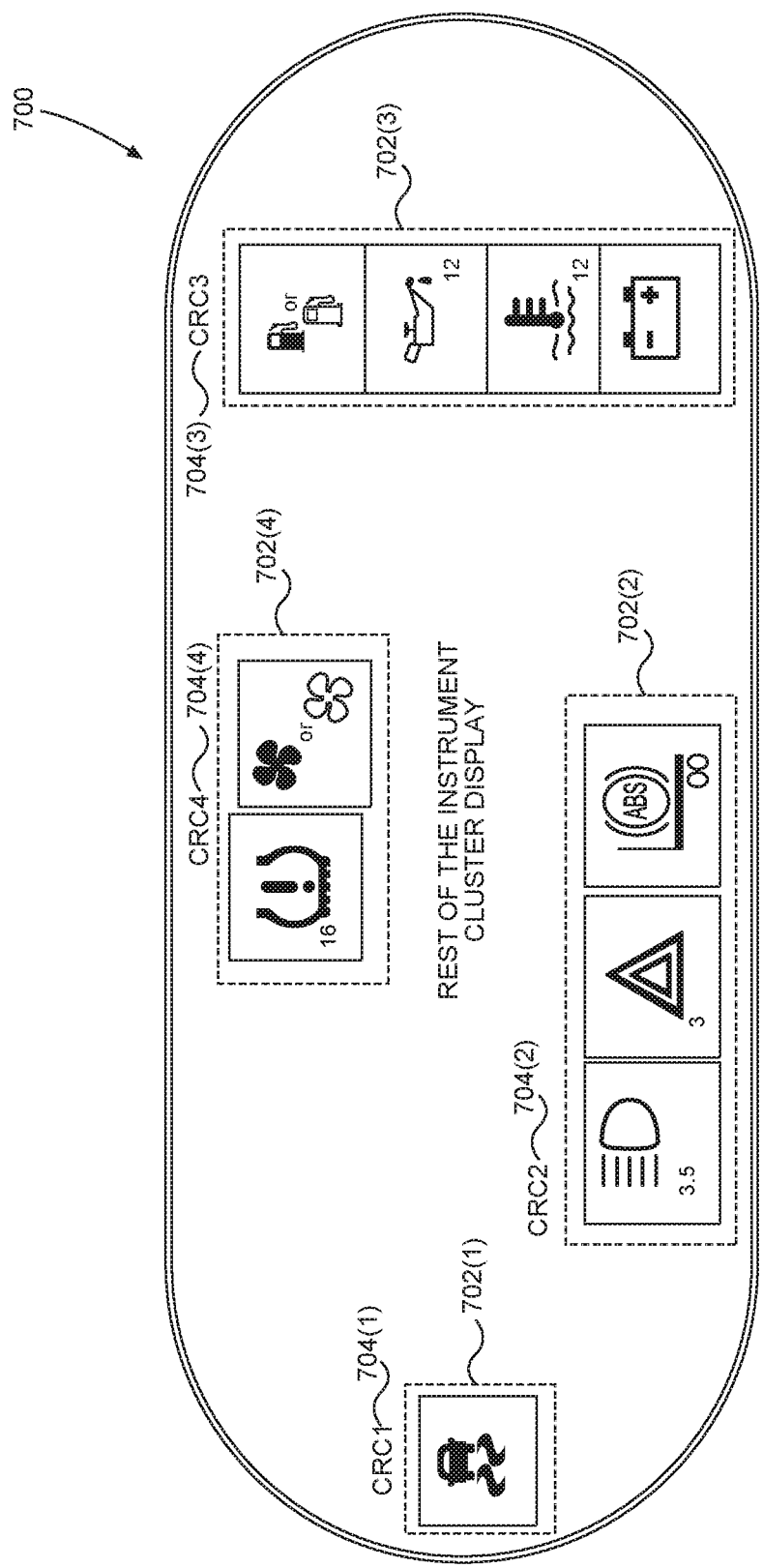
FIGS. 7A and 7B illustrate simplified displays highlighting possible regions of interest that may use a consolidated error detection process according to exemplary aspects of the present disclosure.
Figure 7B:
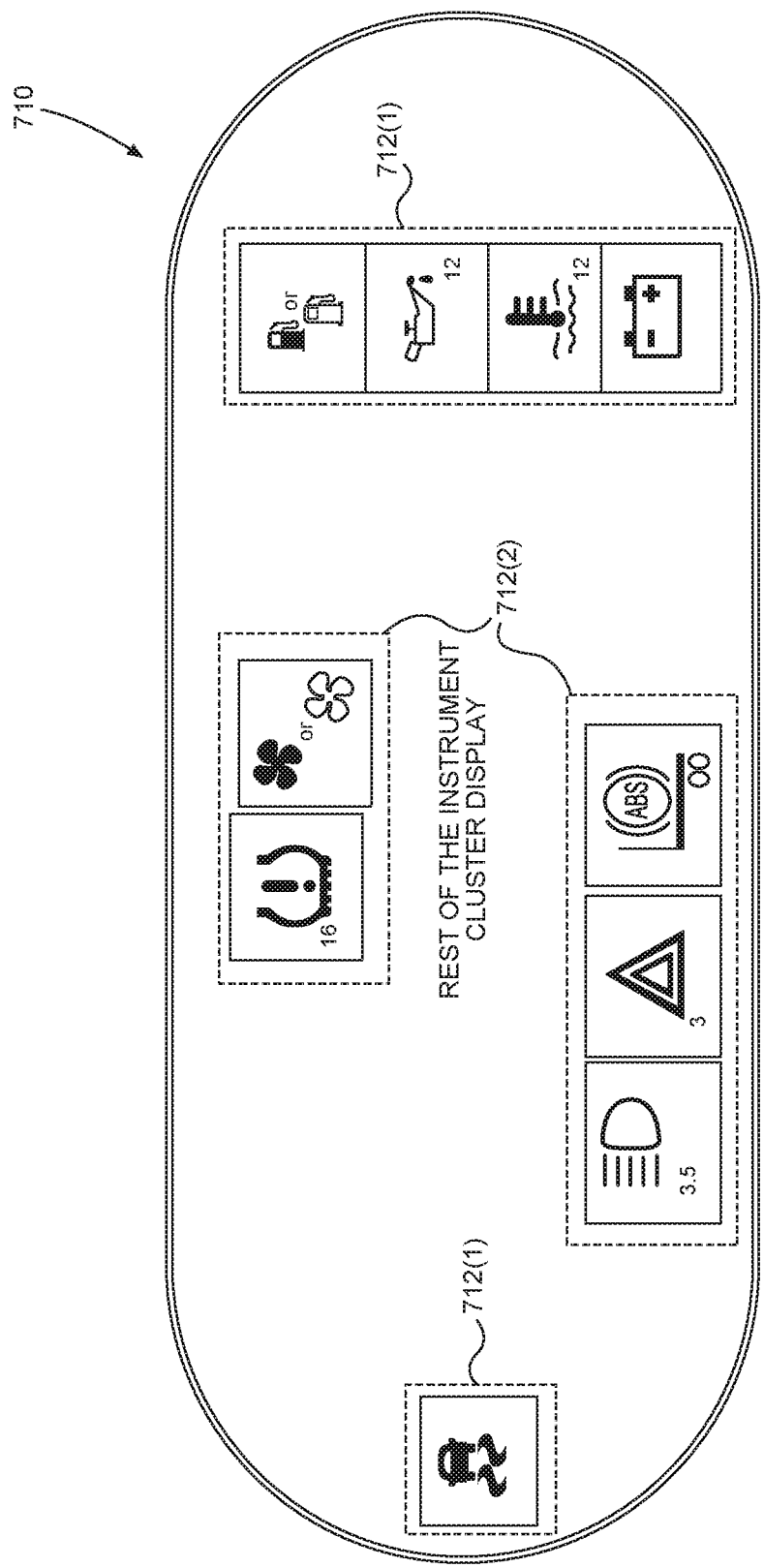

Accordingly, an exemplary aspect of the present disclosure uses a region of interest in the display (e.g., four quadrants of the display) and sends CRC information for the region of interest. Still further, the CRC information need not be sent every frame. By reducing the signaling associated with the CRC, power consumption may be reduced relative to an every frame implementation. In an exemplary aspect, FIG. 7A illustrates a display 700 with four regions of interest 702(1)-702(4), each of which has a corresponding CRC 704(1)-704(4) that is the CRC for the one or more tell-tales that are in the respective region of interest. In contrast, FIG. 7B illustrates a display 710 that has the same tell-tales, but combines them into just two regions of interest 712(1) and 712(2) with associated combined CRCs (not illustrated). By combining tell-tales into a region of interest, less CRC information will be sent, reducing bandwidth requirements. Note that the use of regions of interest would impact the process 600 by changing the calculation of the CRCs (bock 606), the serialization of the CRC (block 614) and the provision of the combined CRC to the TCON (block 620).

Another technique to reduce signaling may be to send the CRC information at a rate less than the display refresh rate. Thus, for example, if the refresh rate is 60 Hz, the CRC information may be sent at some rate less than 60 Hz. Likewise for displays that use some other frequency (e.g., 90 Hz, 120 Hz), the CRC information may be sent at a rate below the display refresh rate. This change in the frequency is an acceptable trade off, because the human eye can generally not discern details at 50-60 Hz. The ability to discern details at these frequencies requires close observation, which a driver typically does not provide to a display given the requirements to be situationally aware. Thus, for example, sending a CRC value every other frame (or less) would halve the CRC data stream and corresponding calculations, reducing the overall demand on the system.

Figure 6B:
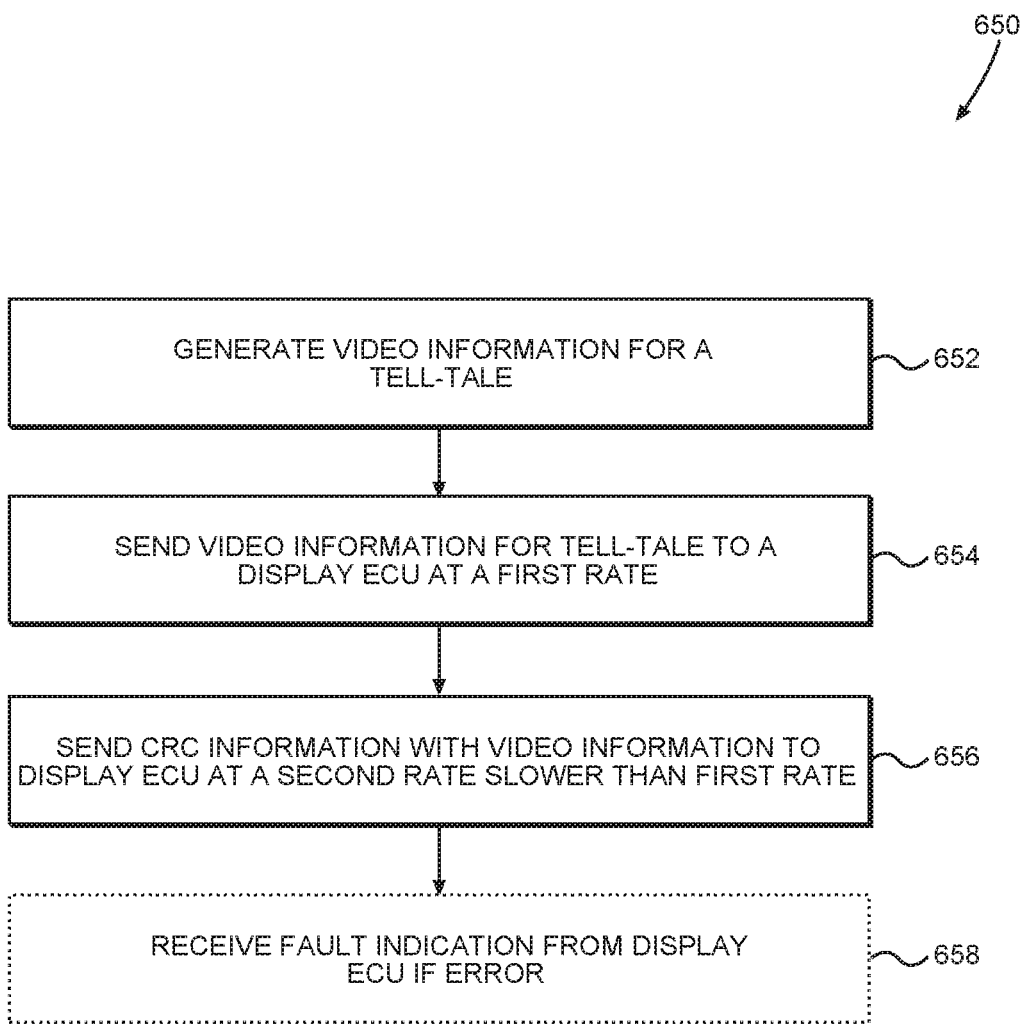
FIG. 6B is a flowchart illustrating an exemplary process where the error detection code is sent with video information at a rate slower than the refresh rate of the video information.

This process is summarized in FIG. 6B as process 650. The combined cluster SoC/MCU 412 generates video information for a tell-tale at a primary control system (block 652). The combined cluster SoC/MCU 412 then sends the video information for the tell-tale to a display ECU 400 at a first rate (block 654) corresponding to a refresh rate of the display. That is, the frequency at which the signal is sent over the bus is independent of this first rate. The cluster SoC/MCU 412 sends CRC information with the video information, but the CRC information is sent at a second rate slower than the first rate (block 656). Again, this rate is relative to the refresh rate of the display, not the frequency of the bus. Optionally, the cluster SoC/MCU 412 may receive a fault indication from the display ECU 400 if there is an error (block 658).

While presented from the perspective of the cluster SoC/MCU 412, it should be appreciated that the display ECU 400 is simply the converse such that where the cluster SoC/MCU 412 sends, the ECU 400 receives and vice versa.

To further assist in managing the CRCs, the CRC information may be sent in a frame with a frame number so that the recipient can tie the CRC information to a specific video frame that is presented for use by the display. The frame number may be an incrementing value, and if no tell-tale is rendered, this frame may include a null packet. To track the frame numbers, the display MCU 402 may include a simple ring counter (e.g., 0-15 or 1-16, but enough bits to make sure that there is a ready ability to correlate the CRC information to the appropriate video frame).

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A method for detecting errors in video information for a tell-tale in a vehicle, the method comprising:
   generating the video information for the tell-tale at a primary control system of the vehicle;
   sending the video information for the tell-tale to a display embedded control unit (ECU) of the vehicle at a first rate, wherein the first rate corresponds to a refresh rate of a display in the display ECU;
   sending, with the video information, a cyclic redundancy check (CRC), associated with the video information, to the display ECU at a second rate slower than the first rate; and
   receiving a fault indication from the display ECU if there is an error in the video information based on the CRC.

2. The method of claim 1, further comprising calculating the CRC at the primary control system.

3. The method of claim 1, further comprising generating and storing the CRC in a memory associated with the primary control system.

4. The method of claim 1, further comprising providing the CRC to the primary control system from an external source.

5. The method of claim 1, wherein the refresh rate of the display in the ECU corresponds to one of 60 Hz, 90 Hz, and 120 Hz.

6. The method of claim 1, wherein sending the CRC comprises sending the CRC in a video blanking portion of the video information.

7. The method of claim 1, wherein receiving the fault indication comprises receiving the fault indication through a backchannel between the primary control system and the display ECU.

8. The method of claim 1, further comprising serializing the video information with a serializer.

9. The method of claim 8, further comprising serializing the CRC with the serializer.

10. The method of claim 1, wherein sending the CRC comprises sending a CRC calculated for a plurality of tell-tales.

11. An embedded control unit (ECU) comprising:
    a bus interface configured to be coupled to a bus;
    a serializer coupled to the bus interface;
    a memory containing video information for rendering a tell-tale and an associated cyclic redundancy check (CRC) for the video information; and
    a control system operatively coupled to the memory and the serializer and configured to:
      send the video information for the tell-tale to a display ECU at a first rate, wherein the first rate corresponds to a refresh rate of a display in the display ECU;
      send, with the video information, the CRC, associated with the video information, to the display ECU at a second rate slower than the first rate; and
      receive a fault indication from the display ECU if there is an error in the video information based on the CRC.

12. The ECU of claim 11, wherein the control system is formed from a system on a chip (SoC) integrated circuitry that includes the memory.

13. The ECU of claim 11, wherein the control system is further configured to receive an indication from a sensor, associated with the ECU, that triggers display of the tell-tale.

14. The ECU of claim 11, wherein the control system is configured to send a single CRC value corresponding to a plurality of tell-tales.

15. A display embedded control unit (ECU) for a vehicle, comprising:
- a bus interface configured to be coupled to a bus;
- a deserializer coupled to the bus interface;
- a timing control (TCON) circuit coupled to the deserializer; and
- a display configured to receive data from the TCON circuit;
- wherein the TCON circuit is configured to:
  - receive video information for a tell-tale at a first rate, wherein the first rate corresponds to a refresh rate of the display;
  - receive an original cyclic redundancy check (CRC), associated with the video information, that has been deserialized by the deserializer from the bus at a second rate slower than the first rate; and
  - calculate a new CRC for comparison with the original CRC.

16. The display ECU of claim 15, wherein the TCON circuit is further configured to send a fault indication when the original CRC does not match the new CRC.

17. The display ECU of claim 15, wherein each CRC corresponds to a plurality of tell-tales for a region of interest in the display.

18. A method comprising:
- receiving video information from a bus at a first rate, wherein the first rate corresponds to a refresh rate of a display on which the video information is rendered;
- receiving cyclic redundancy check (CRC) information associated with the video information at a second rate different than the first rate;
- deserializing the video information;
- calculating a new CRC based on the video information;
- comparing the CRC information to the new CRC; and
- sending a fault indication, for the video information, when the CRC information does not match the new CRC.

19. The method of claim 18, wherein calculating the new CRC is done by a timing control (TCON) circuit associated with the display.

20. The method of claim 18, wherein calculating the new CRC is done by a display microcontroller unit (MCU).

21. The method of claim 18, wherein receiving the video information comprises receiving video information related to a plurality of tell-tales for a region of interest in the display.

* * * * *